United States Patent
Shin et al.

(10) Patent No.: US 7,342,286 B2
(45) Date of Patent: Mar. 11, 2008

(54) ELECTRICAL NODE OF TRANSISTOR AND METHOD OF FORMING THE SAME

(75) Inventors: Seung-Mok Shin, Suwon-si (KR); Jin-Hong Kim, Suwon-si (KR); Soo-Woong Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 9 days.

(21) Appl. No.: 11/319,724

(22) Filed: Dec. 29, 2005

(65) Prior Publication Data

US 2006/0138564 A1    Jun. 29, 2006

(30) Foreign Application Priority Data

Dec. 29, 2004    (KR) ...................... 10-2004-0114987

(51) Int. Cl.
*H01L 29/94* (2006.01)
*H01L 21/4763* (2006.01)

(52) U.S. Cl. .............................. 257/382; 257/E21.577; 438/649

(58) Field of Classification Search ...................... None
See application file for complete search history.

(56) References Cited

U.S. PATENT DOCUMENTS

2004/0038517 A1 *    2/2004  Kang et al. ................. 438/630

FOREIGN PATENT DOCUMENTS

| JP | 2003-203976 | 7/2003 |
|---|---|---|
| KR | 10-1999-0086740 | 12/1999 |
| KR | 1020040017038 | 2/2004 |

* cited by examiner

*Primary Examiner*—Sue A. Purvis
*Assistant Examiner*—Kevin Quinto
(74) *Attorney, Agent, or Firm*—Harness, Dickey & Pierce, P.L.C.

(57) ABSTRACT

According to example embodiments of the present invention, there are provided an electrical node of a transistor and a method of forming the same, which may reduce or minimize current leakage between the electrical node and a semiconductor substrate when a buried contact hole exposing at least the side of an active region is arranged on the semiconductor substrate. Two gate patterns may be formed on the active region of the semiconductor substrate. Conductive layer patterns may be formed in the gate patterns and in the semiconductor substrate between the gate patterns. A buried interlayer insulating layer may be formed on the semiconductor substrate to cover the gate patterns. A buried contact hole which passes through the buried interlayer insulating layer and exposes the conductive layer pattern of the semiconductor substrate may be formed. The buried contact hole may be formed to expose at least the side of the active region. An impurity region may be formed in the semiconductor substrate below the buried contact hole. A contact hole spacer covering the sidewall of the buried contact hole may be formed. A buried conductive layer which covers the contact hole spacer and fills the buried contact hole may be formed.

25 Claims, 19 Drawing Sheets

ELECTRICAL NODE OF TRANSISTOR AND METHOD OF FORMING THE SAME

PRIORITY CLAIM

This application claims priority under 35 U.S.C. § 119 of Korean Patent Application No. 10-2004-0114987, filed on Dec. 29, 2004, in the Korean Intellectual Property Office, the entire contents of which are incorporated herein by reference.

BACKGROUND OF THE INVENTION

1. Field of the Invention

Example embodiments of the present invention relate to a transistor and a method of forming the same, and more particularly, to an electrical node of a transistor and a method of forming the same.

2. Description of the Related Art

A transistor may be formed on a semiconductor substrate having a gate pattern and at least three electrical nodes in a semiconductor device. The electrical nodes may be arranged on the semiconductor substrate using at least a conductive layer. The gate pattern may control the charge flow in the semiconductor substrate. The semiconductor substrate may make contact with the electrical nodes through active regions which may contain impurity regions. The electrical nodes may be arranged on the semiconductor substrate so that they are not located at the sides of the active regions. To reduce current leakage during transistor operation, the electrical nodes may be arranged on the active regions to reduce damage generated during manufacture of the semiconductor device. However, because the semiconductor device may be miniaturized to a submicron unit or less (depending on a desired design rule), the transistor may be formed so that the electrical nodes may be located at the sides of the active regions. Additionally, the electrical nodes may be adjacent to gate patterns. This configuration may increase the current leakage generated during transistor operation.

According to a conventional method of solving the current leakage problem, a dielectric layer is formed on a semiconductor substrate. A contact opening for exposing the semiconductor substrate may be formed in the dielectric layer. A silicon nitride spacer may be formed on the sidewall of the contact opening. A cobalt layer may be formed on the bottom of the contact opening. An ionized metal plasma titanium layer may be formed on the cobalt layer and a titanium nitride layer may be formed thereon using chemical vapor deposition.

Subsequently, the semiconductor substrate having the titanium nitride layer and cobalt layer may undergo a first rapid thermal process to cause reaction between the semiconductor substrate and the cobalt layer to form a cobalt silicide layer. The titanium nitride layer and a non-reactive part of the cobalt layer, and the ionized metal plasma titanium layer may be removed using a wet etching method. The semiconductor substrate having the cobalt silicide layer may be subjected to a second rapid thermal process and a conductive layer may be used to fill the contact opening. While this method may reduce charge loss due to mobile ions of the sidewall of the contact opening (to a submicron unit or less), this method may not reduce the current leakage due to the charges flowing in the semiconductor substrate. This is because the side of the active region is exposed via the contact opening in the photolithographic and etching processes in the so-formed apparatus.

SUMMARY

Example embodiments of the present invention provide an electrical node of a transistor suitable for reducing or minimizing current leakage. Example embodiments of the present invention provide an electrical node of a transistor suitable for reducing or minimizing current leakage between a semiconductor substrate and an electrical node filling a buried contact hole that may be located at a side portion of an active region in a NOR type flash memory.

Example embodiments of the present invention also provide a method of forming an electrical node of a transistor capable of reducing or minimizing current leakage. Example embodiments of the present invention also provide a method of forming an electrical node of a transistor capable of reducing or minimizing current leakage between a semiconductor substrate and the electrical node filling a buried contact hole that may be located at a side portion of an active region in a NOR type flash memory.

According to an example embodiment of the present invention, there are provided an electrical node of a transistor and a method of forming the same in, for example, a NOR flash memory or other type of memory. Pursuant to an example embodiment of the present invention, the electrical node may include two gate patterns formed on the active region of the semiconductor substrate. Each of the gate patterns may have a conductive layer pattern. A buried interlayer insulating layer may be formed on the semiconductor substrate to cover the gate patterns. A buried contact hole may be formed in the buried interlayer insulating layer to be located between the gate patterns. An impurity region may be formed in the semiconductor substrate below the buried contact hole to be located between the gate patterns. A contact hole spacer may be formed on the sidewall of the buried contact hole. A buried conductive layer which may cover the contact hole spacer and may fill the buried contact hole may be formed. The conductive layer pattern also may be formed in the semiconductor substrate between the gate patterns. Additionally, the buried contact hole optionally having vertically oriented sidewalls may be arranged on the conductive layer pattern of the semiconductor substrate. Further, the vertically oriented sidewalls of the buried contact hole may be situated to be aligned with a vertical plane passing through a portion of the active region.

According to an example embodiment of the present invention, a method of forming an electrical node may include forming two gate patterns on an active region of a semiconductor substrate. In an example embodiment of the present invention, the two gate patterns may include at least one conductive layer pattern formed on the gate patterns and on the semiconductor substrate located between the gate patterns. A buried interlayer insulating layer may be formed on the semiconductor substrate to cover the gate patterns. A buried contact hole which may pass through the buried interlayer insulating layer and may expose the conductive layer pattern of the semiconductor substrate may be formed. An impurity region may be formed in the semiconductor substrate below the buried contact hole. A contact hole spacer covering the sidewall of the buried contact hole may be formed. A buried conductive layer which may cover the contact hole spacer and may fill the buried contact hole may be formed. The buried contact hole may be formed to expose at least the side of the active region.

BRIEF DESCRIPTION OF THE DRAWINGS

Example embodiments of the present invention will be more clearly understood from the detailed description taken in conjunction with the accompanying drawings.

According to example embodiments of the present invention.

According to example embodiments of the present invention.

DETAILED DESCRIPTION OF EXAMPLE EMBODIMENTS OF THE INVENTION

Figure 1:
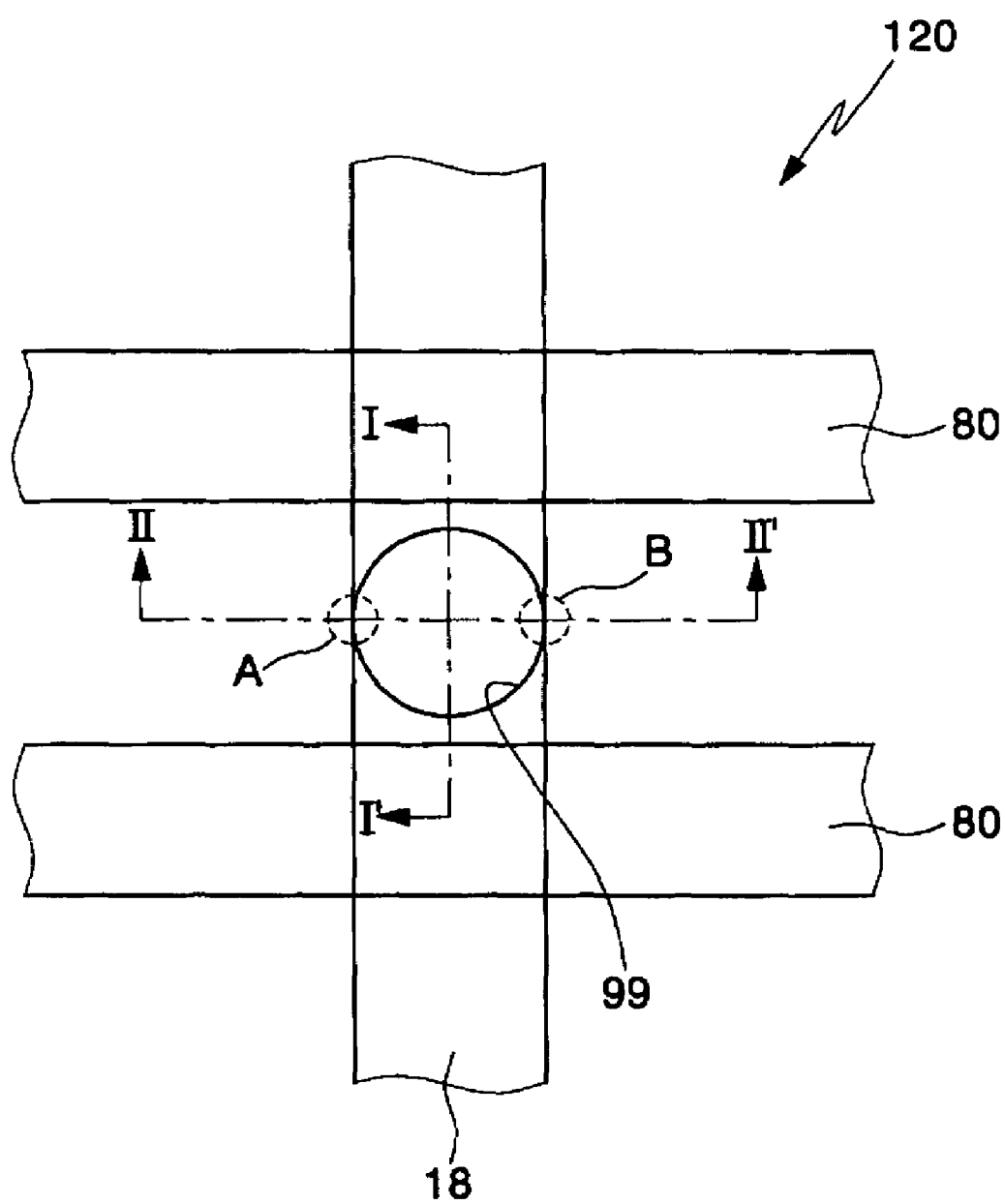
FIG. 1 is a layout diagram of a semiconductor device according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, various example embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

An electrical node of a transistor and a method of forming the same according to example embodiments of the present invention will be described in detail with reference to the attached drawings.

FIG. 1 is a layout diagram of a semiconductor device according to an example embodiment of the present invention. The example embodiments of FIGS. 2 and 3 of the present invention are cross-sectional views taken along lines I-I' and II-II' of FIG. 1, respectively.

Figure 2:
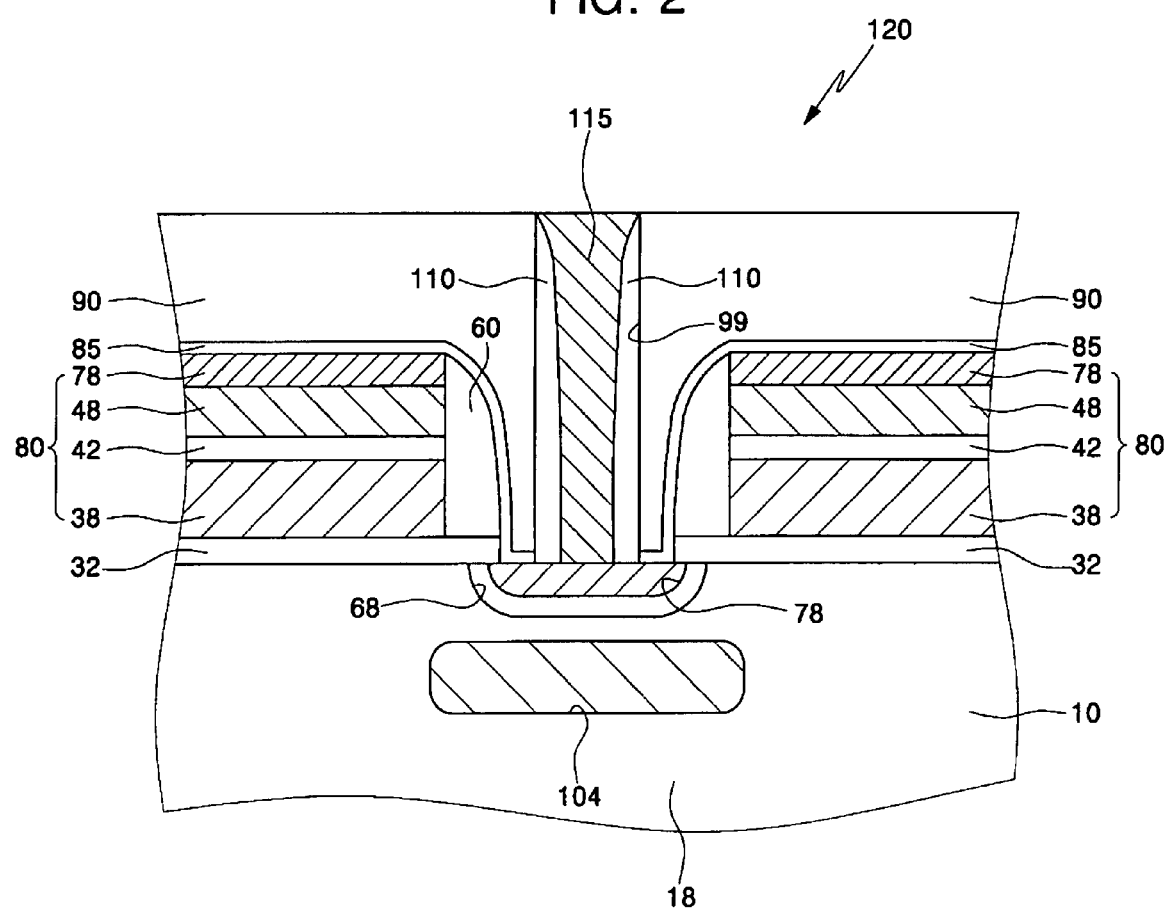
FIGS. 2 and 3 are cross-sectional views taken along lines I-I' and II-II' of FIG. 1, respectively.
Figure 3:
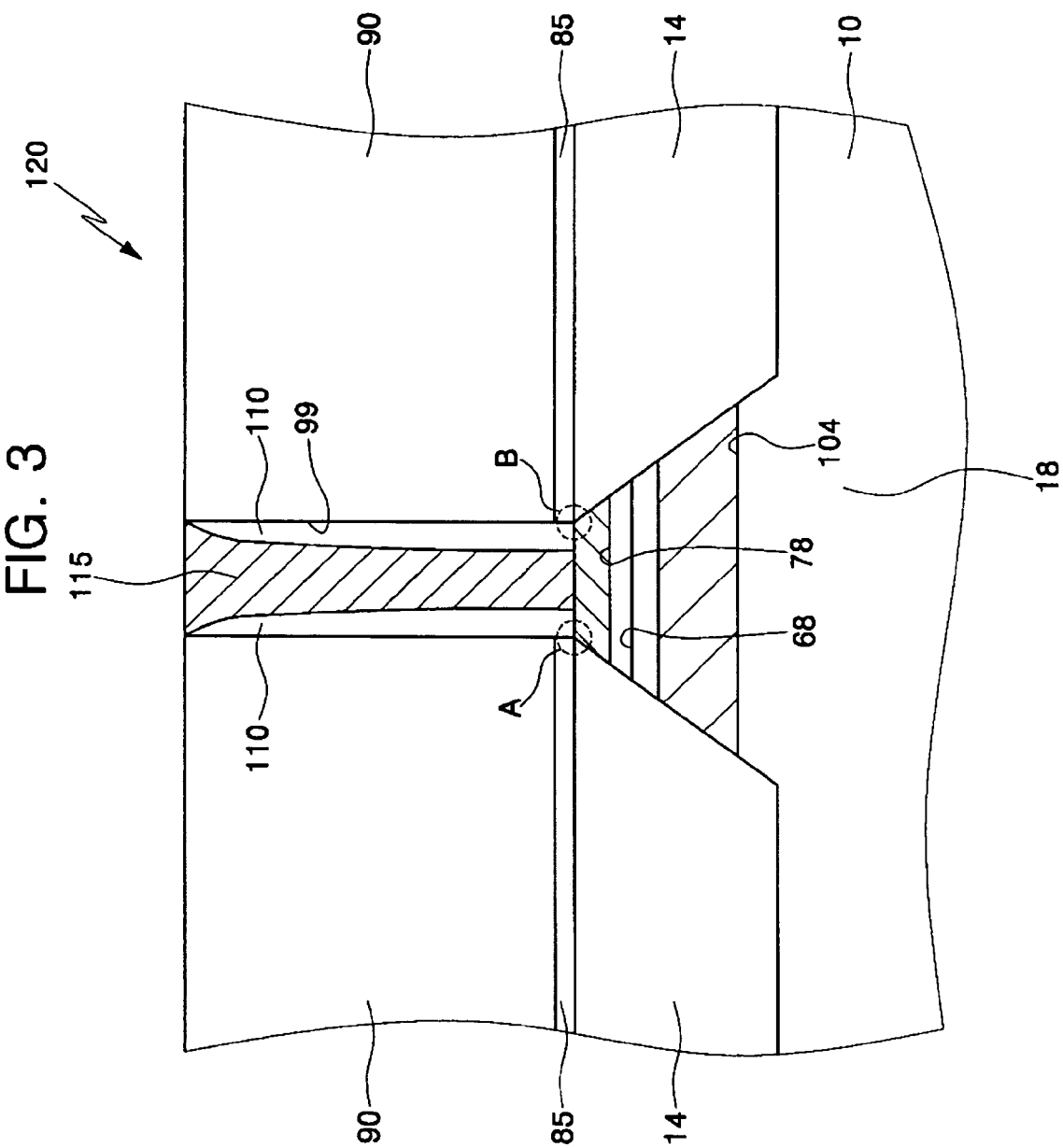
Figure 4:
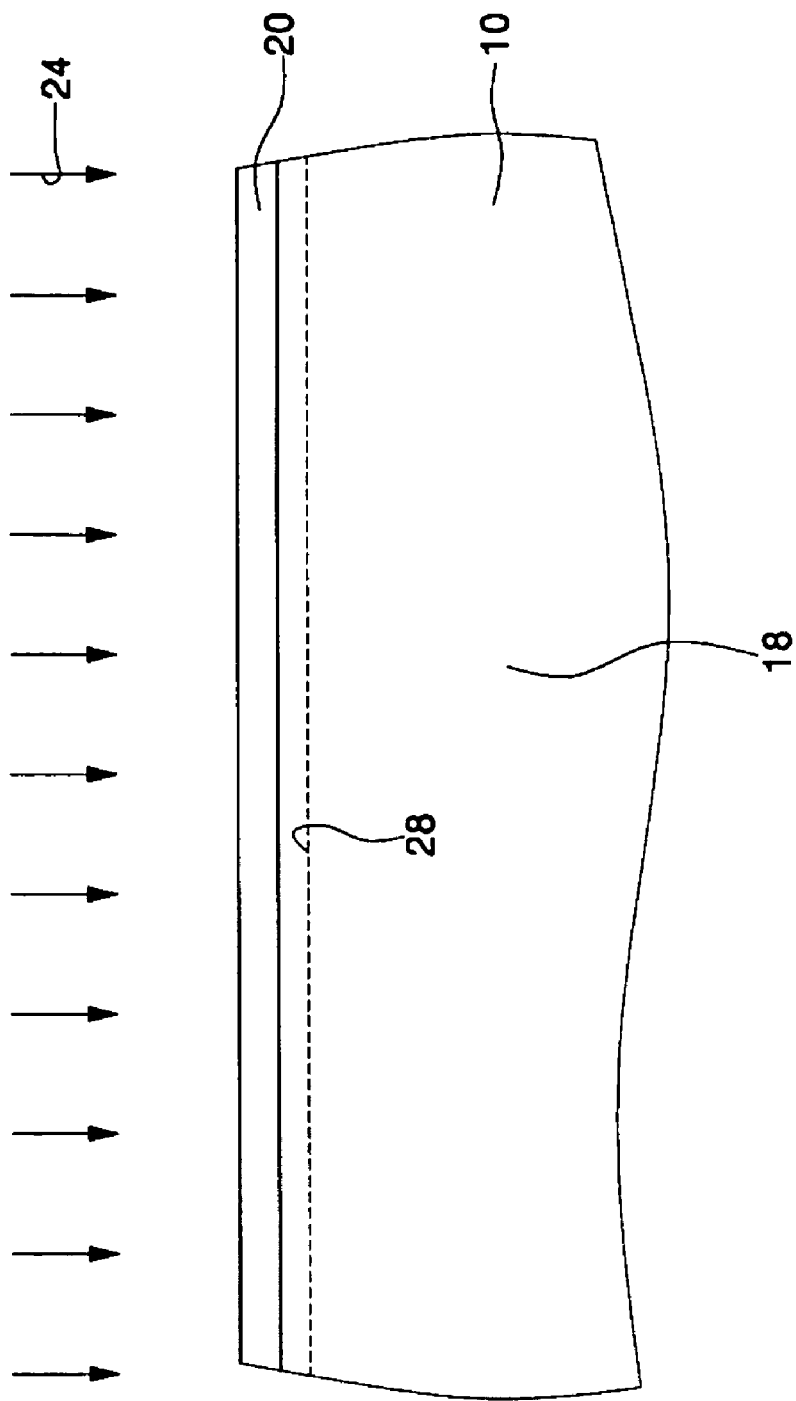
FIGS. 4, 6, 8, 10, 12, 14, 16, and 18 are cross-sectional views taken along the line I-I' of FIG. 1 illustrating intermediate or final structures; and According to example embodiments of the present invention.
Figure 5:
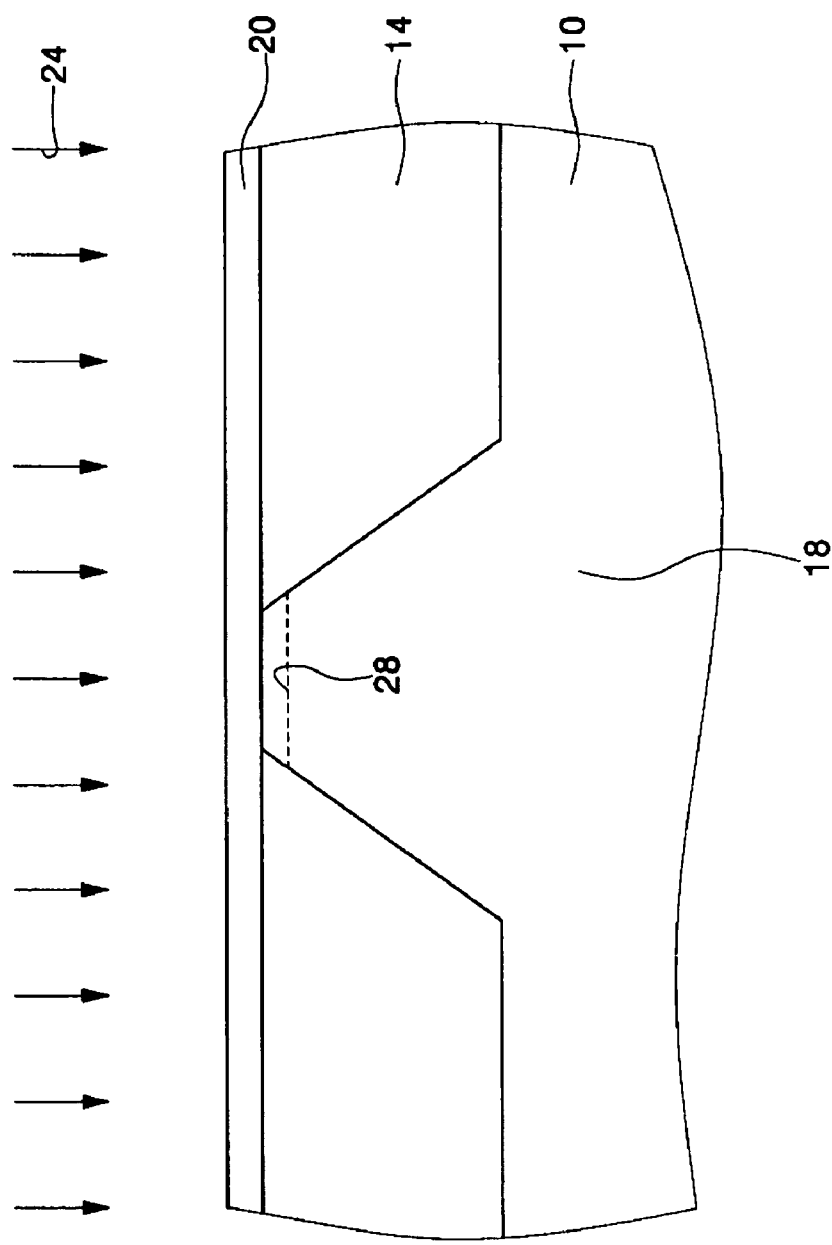
FIGS. 5, 7, 9, 11, 13, 15, 17, and 19 are cross-sectional views taken along the line II-II' of FIG. 1 illustrating intermediate or final structures.

Referring to the example embodiments of FIGS. 1 through 3 of the present invention, in a NOR type flash memory (or other suitable type of memory or device), two gate insulating layer patterns 32 are disposed on an active region 18 of a semiconductor substrate 10, and gate patterns 80 are disposed on the patterns 32. According to an example embodiment of the present invention, each of the gate patterns 80 includes a first polysilicon layer pattern 38, a dielectric layer pattern 42, a second polysilicon layer pattern 48, and/or a conductive layer pattern 78 laminated in sequence. Pursuant to an example embodiment of the present invention, the conductive layer pattern 78 may be disposed in the semiconductor substrate 10 between the gate patterns 80. According to an example embodiment of the present invention, the gate insulating layer pattern 32 may be made of silicon oxide ($SiO_2$) or silicon oxynitride ($Si_xO_yN_z$). In accordance with another example embodiment of the present invention, after the gate patterns 80 are formed, an impurity region (not shown) may be formed on the gate patterns 80. According to an example embodiment of the present invention, the impurity region may include N-type impurity ions. Also, according to an example embodiment of the present invention, the semiconductor substrate 10 may include P-type impurity ions.

According to an example embodiment of the present invention, the second polysilicon layer pattern 48 and the first polysilicon layer pattern 38 may have N+-type impurity ions. Pursuant to an example embodiment of the present invention, the dielectric layer pattern 42 may include a silicon oxide layer, a silicon nitride layer ($Si_3N_4$), and/or a silicon oxide layer laminated in sequence. The conductive layer pattern 78 may be made of metal silicide containing cobalt (Co), in accordance with another example embodiment of the present invention. According to an example embodiment of the present invention (see FIG. 3), the active region 18 may be disposed in the semiconductor substrate 10 so that it may be isolated by a device isolation layer 14.

Referring to the example embodiment of FIG. 2 of the present invention, gate spacers 60 may be disposed on the sidewalls of the gate patterns 80. According to another example embodiment of the present invention, the gate spacers 60 may be made of silicon nitride. Alternatively, the gate spacers 60 may be made of a silicon oxide layer and a silicon nitride layer laminated in sequence. Referring to the example embodiments of FIGS. 2 and 3 of the present invention, another impurity region 68 surrounding the conductive layer pattern 78 of the semiconductor substrate 10 may be formed to overlap with the gate spacers 60. According to another example embodiment of the present invention, the impurity region 68 may have conductive type impurity ions (the same as those used for semiconductor substrate 10), for example, P+-type impurity ions. Alternatively, the impurity region 68 may have conductive type impurity ions (different from those used for the semiconductor substrate 10), for example, N+-type impurity ions. According to yet another example embodiment of the present invention, an etch buffer layer 85 and/or a buried interlayer insulating layer 90 may be disposed on the gate patterns 80, the gate spacers 60, and/or the semiconductor substrate 10 in sequence as depicted in FIGS. 2 and 3. The buried interlayer insulating layer 90 may have an etching rate different from that of the gate spacer 60 in accordance with an example embodiment of the present invention. Alternatively, the etch buffer layer 85 may have an etching rate equal to that of the gate spacer 60 according to another example embodiment of the present invention.

Referring to the example embodiments of FIGS. 2 and 3, a buried contact hole 99 may be formed in the buried interlayer insulating layer 90 and the etch buffer layer 85. The buried contact hole 99 may be located between the gate patterns 80 in a direction perpendicular to the gate patterns 80 and arranged above the conductive layer pattern 78 of the semiconductor substrate 10, as shown, for example, in the example embodiments of FIGS. 2 and 3 of the present invention. Also, the buried contact hole 99 may be located between portions of the device isolation layer 14 as depicted in the example embodiment of FIG. 3. The vertically oriented sidewall of the buried contact hole 99 may be located so as to pass through side portions A and B of the active region 18, as shown/depicted in FIG. 3.

Another impurity region 104 may be disposed in the semiconductor substrate 10 below the buried contact hole 99 located between the gate patterns 80 as shown in FIGS. 2 and 3. Also, the impurity region 104 may be arranged below the conductive layer pattern 78 of the semiconductor substrate 10. The impurity region 104 may include conductive type impurity ions (the same as those of the semiconductor substrate 10), for example, P+-type impurity ions. Alternatively, the impurity region 104 may include conductive type impurity ions (different from those of the semiconductor substrate 10), for example, N+-type impurity ions.

According to the example embodiments of FIGS. 2 and 3 of the present invention, a contact hole spacer 110 may be disposed on the sidewall of the buried contact hole 99, and a buried conductive layer 115 may be formed which covers the contact hole spacer 110 and fills the buried contact hole 99. According to an example embodiment of the present invention, the buried conductive layer 115 may be formed of tungsten. According to another example embodiment of the present invention, the contact hole spacer 110 may have an etching rate equal to that of the gate spacer 60. Thus, as described in conjunction with the example embodiments of FIGS. 1-3 of the present invention, the transistor 120 including the buried conductive layer 115, the gate patterns 80, and the conductive layer patterns 78 may be formed. Pursuant to another example embodiment of the present invention, a channel impurity region (not shown) may be disposed in the semiconductor substrate 10 before forming the gate patterns 80 on the semiconductor substrate 10. According to an example embodiment of the present invention, the channel impurity region may be located below the gate patterns 80 to adjust a threshold voltage of the transistor 120. According to another example embodiment of the present invention, the channel impurity region may include conductive type impurity ions (the same as those of the semiconductor substrate 10), for example, P-type impurity ions. Alternatively, according to yet another example embodiment of the present invention, the channel impurity region may include conductive type impurity ions (different from those of the semiconductor substrate 10), for example, N-type impurity ions.

When the buried contact hole 99 (surrounding buried conductive layer 115) passes through the device isolation layer 14 and is arranged on the semiconductor substrate 10 (according to an example embodiment of the present invention), the impurity region 104 may be arranged below the conductive layer pattern 78 of the semiconductor substrate 10. Referring to the example embodiments of FIGS. 2-3 of the present invention, when the vertically oriented sidewalls of the buried contact hole 99 are located so as to pass through the side portions A and B of the active region 18, the contact hole spacer 110 may be used to reduce a region in which the buried contact hole 99 is formed in the device isolation layer 14 as shown.

FIGS. 4, 6, 8, 10, 12, 14, 16, and 18 are cross-sectional views taken along the line I-I' of FIG. 1 illustrating intermediate or final structures according to example embodiments of the present invention. FIGS. 5, 7, 9, 11, 13, 15, 17, and 19 are cross-sectional views taken along the line II-II' of FIG. 1 also illustrating intermediate or final structures according to example embodiments of the present invention.

Referring to the example embodiments of FIG. 1 and FIGS. 4 through 7 of the present invention, the device isolation layer 14 may be formed in the semiconductor substrate 10. According to an example embodiment of the present invention, the device isolation layer 14 may be formed in the semiconductor substrate 10 to isolate the active region 18. According to another example embodiment of the present invention, the semiconductor substrate 10 may have P-type impurity ions. Referring to the example embodiments of FIGS. 4 and 5 of the present invention, an ion implanted buffer layer 20 may be formed on the semiconductor substrate 10. A channel impurity region 28 may be formed in the semiconductor substrate 10 using the ion implanted buffer layer 20. The channel impurity region 28 may be formed in the semiconductor substrate 10 by performing at least an ion implanting process 24. According to an example embodiment of the present invention, the channel impurity region 28 may include conductive type impurity ions (same as those of the semiconductor substrate 10), for example, P-type impurity ions. Alternatively, according to another example embodiment of the present invention, the channel impurity region 28 may include conductive type impurity ions (different from those of the semiconductor substrate 10), for example, N-type impurity ions.

Figure 6:
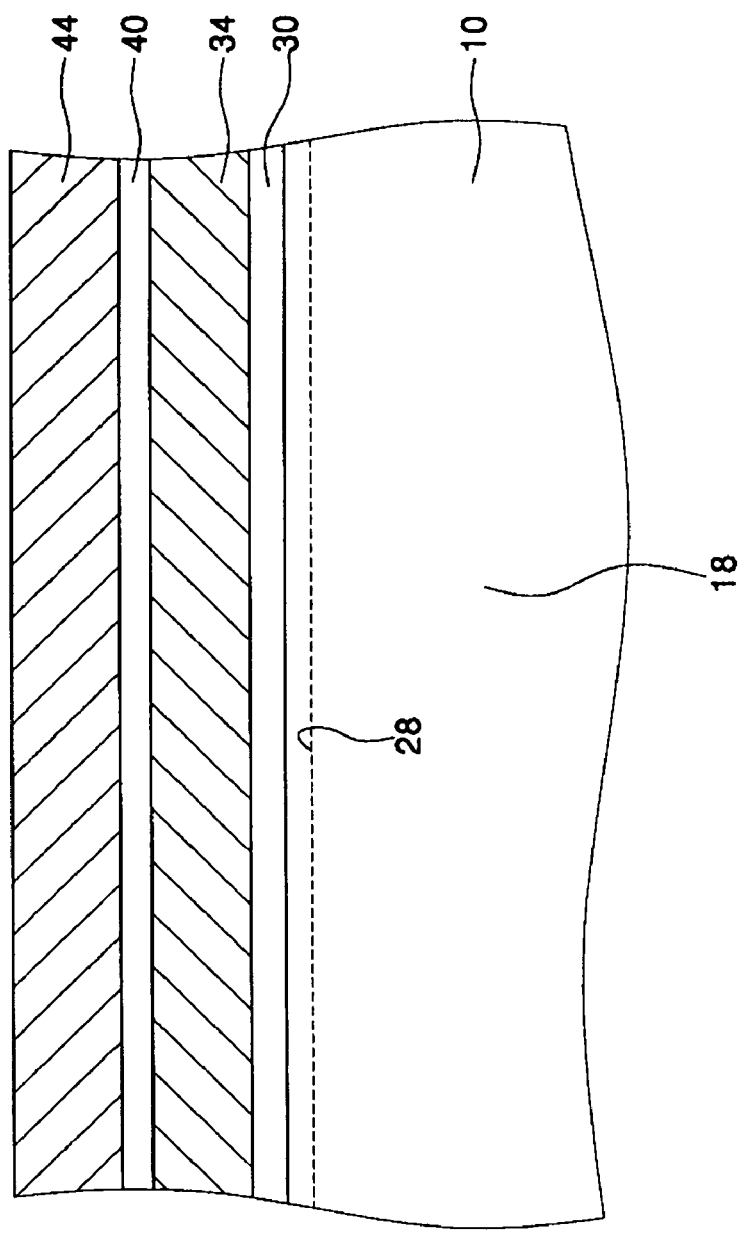
Figure 7:
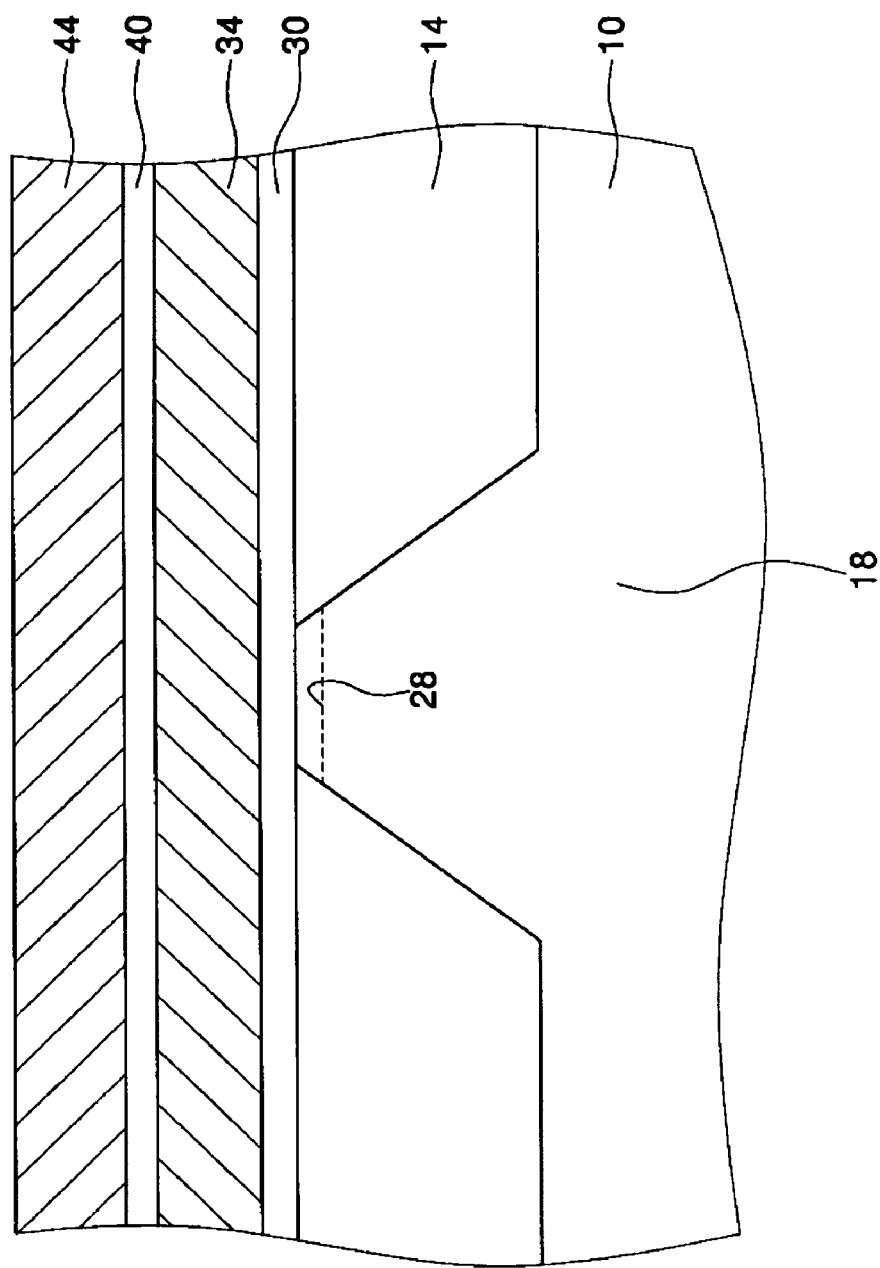

Referring to the example embodiments of FIGS. 6 and 7 of the present invention, a gate insulating layer 30, a first polysilicon layer 34, a dielectric layer 40, and/or a second polysilicon layer 44 may be formed on the semiconductor substrate 10 in sequence. The first polysilicon layer 34 and the second polysilicon layer 44 may have N+-type impurity ions. The dielectric layer 40 may be formed by laminating a silicon oxide ($SiO_2$) layer, a silicon nitride ($Si_3N_4$) layer, and a silicon oxide layer in sequence. The gate insulating layer 30 may be formed of silicon oxide or silicon oxynitride ($Si_xO_yN_z$).

Figure 8:
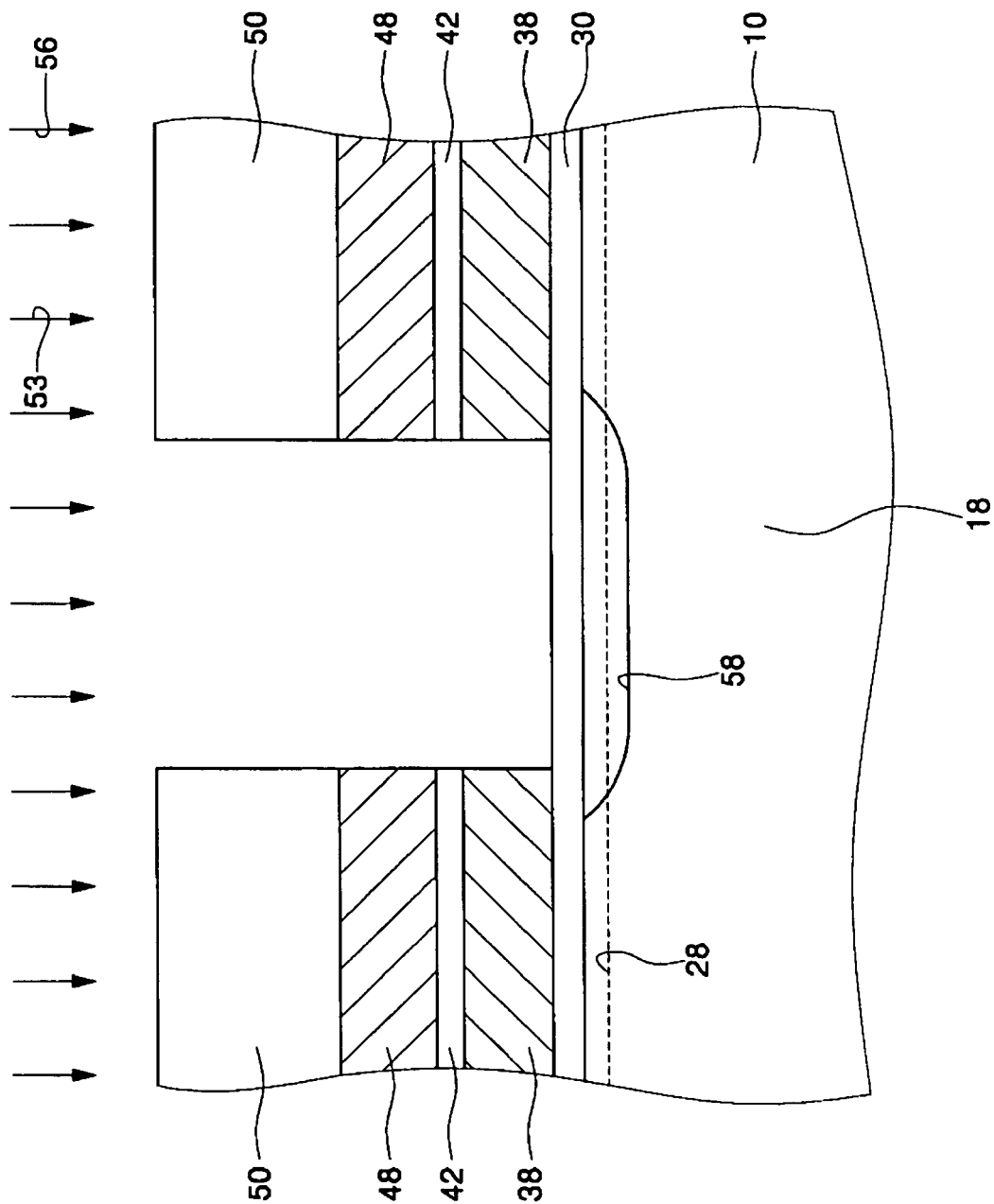
Figure 9:
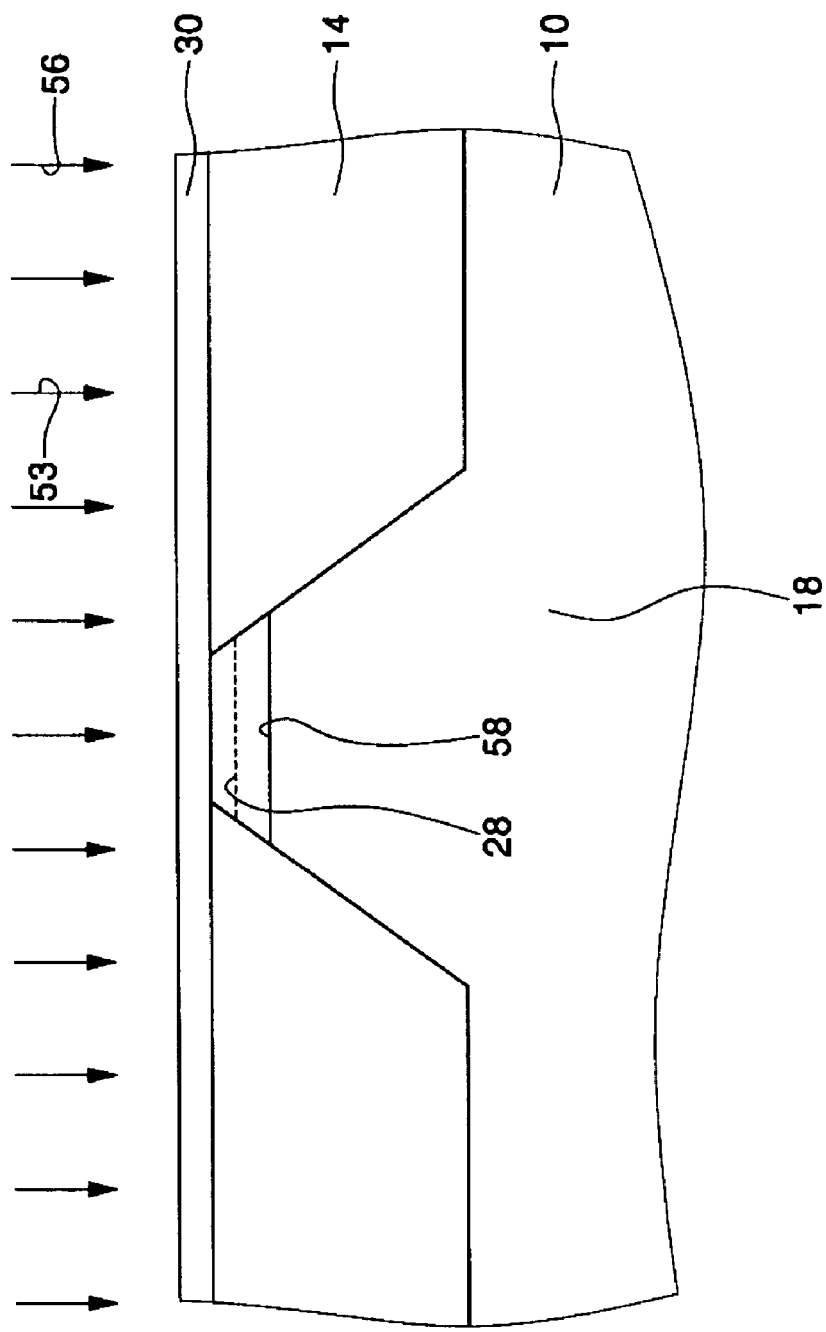

Referring to the example embodiments of FIG. 1 and FIGS. 8 through 11 of the present invention, photoresist patterns 50 may be formed on the second polysilicon layer 44. The photoresist pattern 50 may have a bar shape as shown in FIGS. 8 and 9. Referring to the example embodiments of FIGS. 8 and 9 of the present invention, the second polysilicon layer 44, the dielectric layer 40, and the first polysilicon layer 34 may be subjected to an etching process 53 using the photoresist patterns 50 as an etching mask to expose the gate insulating layer 30. By the etching process 53, the first polysilicon layer patterns 38, the dielectric layer patterns 42, and the second polysilicon layer patterns 48 laminated in sequence may be formed between the gate insulating layer 30 and the photoresist patterns 50 as depicted, for example, in the example embodiments of FIGS. 8-9 of the present invention.

The semiconductor substrate 10 may be subjected to an ion implanting process 56 using the photoresist patterns 50, the second polysilicon layer patterns 48, the dielectric layer patterns 42, and the first polysilicon layer patterns 38 as a mask. By the ion implanting process 56, an impurity region 58 may be formed in the semiconductor substrate 10 between the first polysilicon layer patterns 38 as depicted in FIGS. 8 and 9. The impurity region 58 may have N-type impurity ions. The impurity region 58 may be formed in the semiconductor substrate 10 to overlap with the first polysilicon layer patterns 38 as depicted in FIG. 8. After the impurity region 58 may be formed, the photoresist patterns 50 may be removed from the semiconductor substrate 10 as depicted in FIG. 10.

Figure 10:
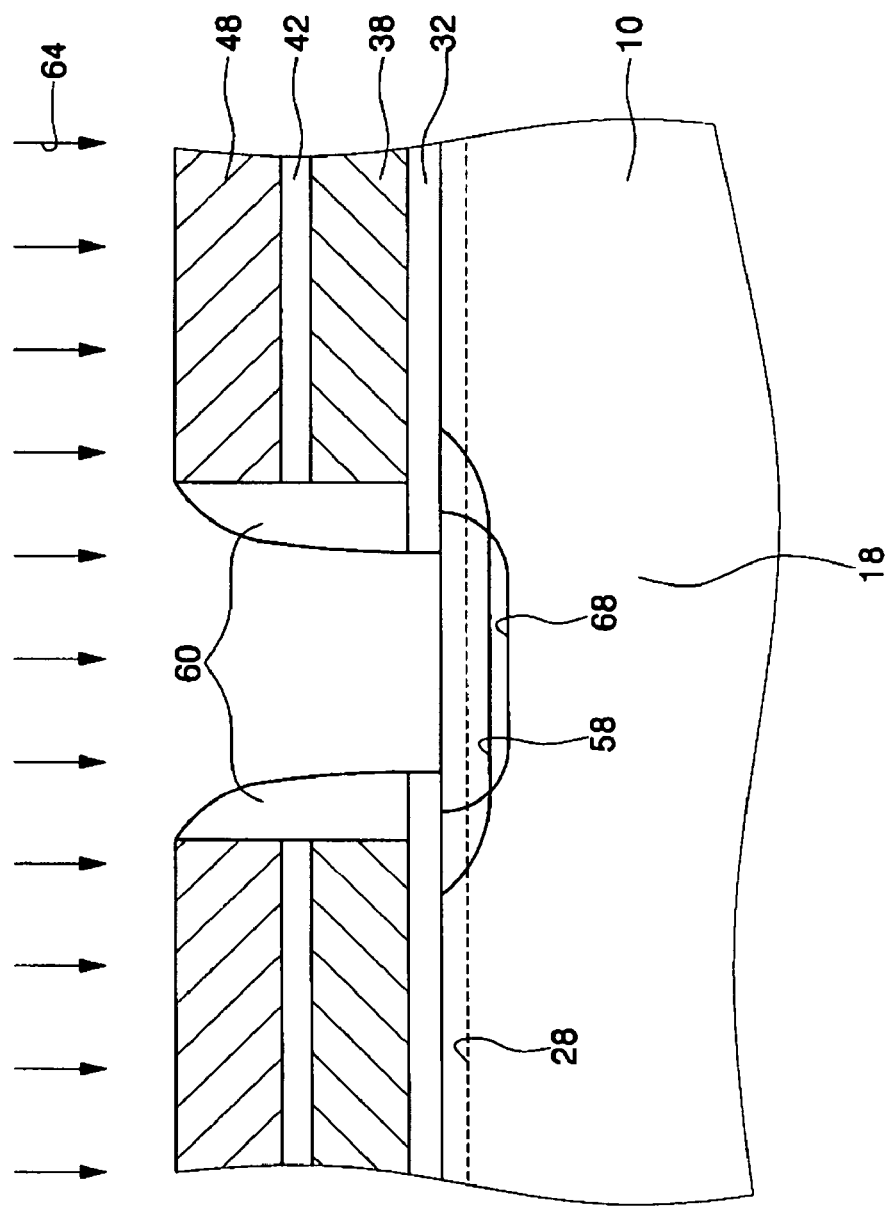
Figure 11:
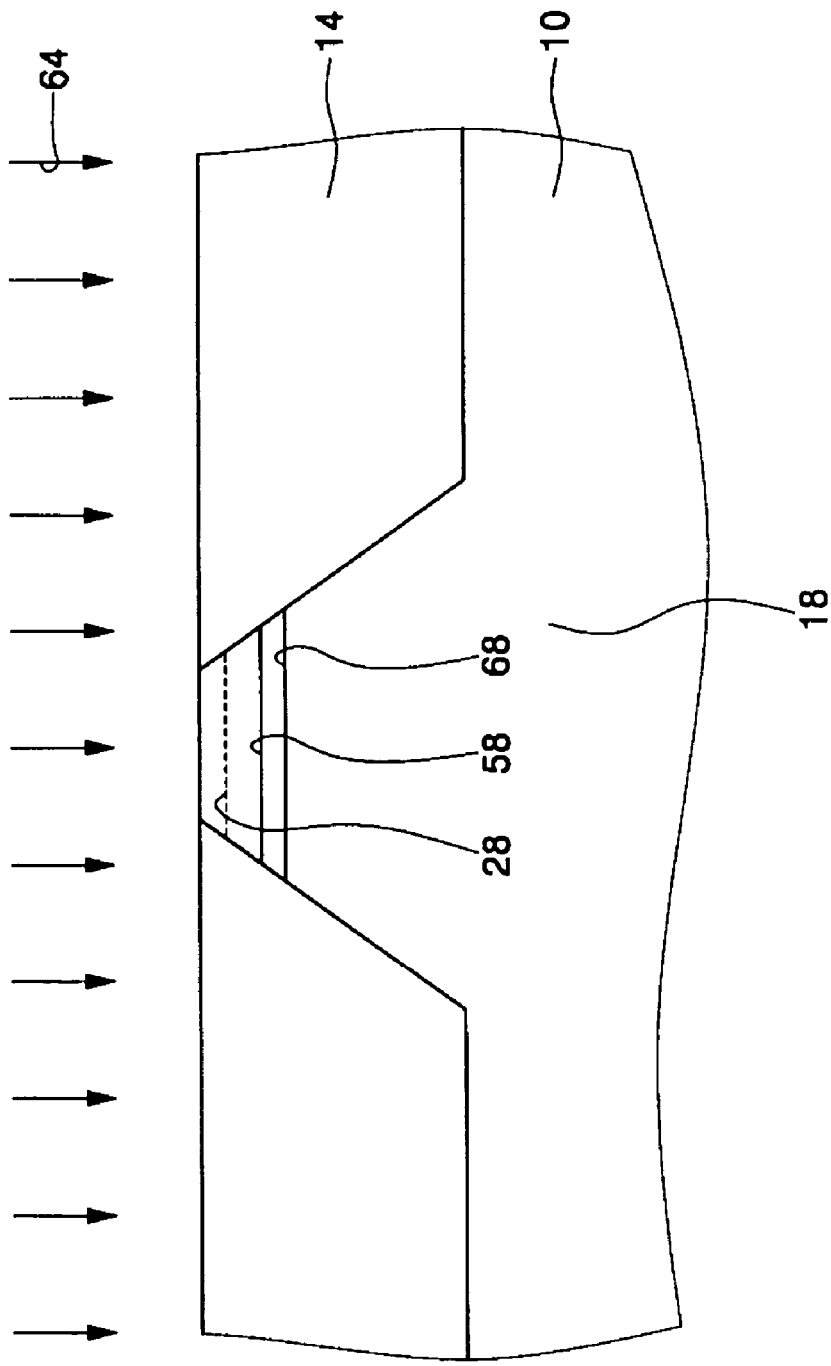

Referring to the example embodiments of FIGS. 10 and 11 of the present invention, the gate spacers 60 may be formed on the sidewalls of the first polysilicon layer patterns 38, the dielectric layer pattern 42, and the second polysilicon layer pattern 48, respectively. According to an example embodiment of the present invention, the gate spacers 60 may be formed of silicon nitride. Alternatively, according to another example embodiment of the present invention, the gate spacers 60 may be formed by laminating a silicon oxide layer and a silicon nitride layer in sequence. The gate spacers 60 may be formed on the gate insulating layer patterns 32 followed by exposing the semiconductor substrate 10 beneath layer 32 between gate spacers 60 as depicted in FIG. 10. The semiconductor substrate 10 may be subjected to an ion implanting process 64 using the first polysilicon layer pattern 38, the dielectric layer patterns 42, the second polysilicon layer patterns 48, and the gate spacers 60 as a mask. By the ion implanting process 64, another impurity region 68 may be formed in the semiconductor substrate 10 between the gate spacers 60 as depicted in FIGS. 9 and 10. The impurity region 68 may have conductive type impurity ions (the same as those of the semiconductor substrate 10), for example, P+-type impurity ions. Alternatively, the impurity region 68 may have conductive type impurity ions (different from those of the semiconductor substrate 10), for example, N+-type impurity ions.

Referring to the example embodiments of FIG. 1 and FIGS. 12 through 15 of the present invention, a conductive layer 70 which covers the gates 80, and the semiconductor layer 70 may be formed. The conductive layer 70 may be formed of metal containing cobalt (Co). The semiconductor substrate 10 having the conductive layer 70 may be subjected to at least a semiconductor thermal process 74. By the semiconductor thermal process 74, the conductive layer patterns 78 may be formed on the second polysilicon layer patterns 48 and the semiconductor substrate 10, respectively. That is, the conductive layer patterns 78 may be formed of metal silicide containing cobalt. According to an example embodiment of the present invention, after the semiconductor thermal process 74 is performed, the conductive layer 70 may be removed from the semiconductor substrate 10.

Figure 12:
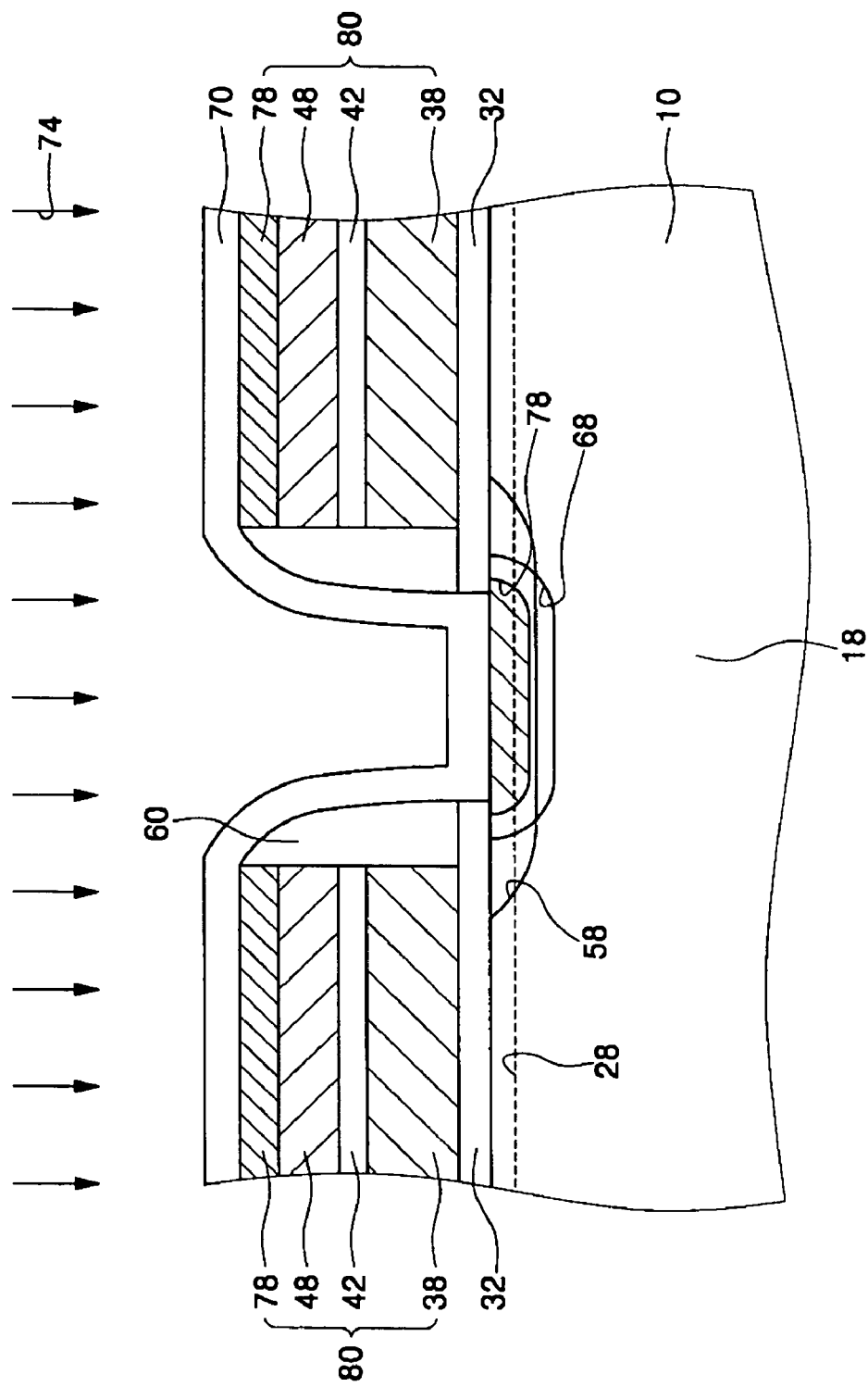
Figure 13:
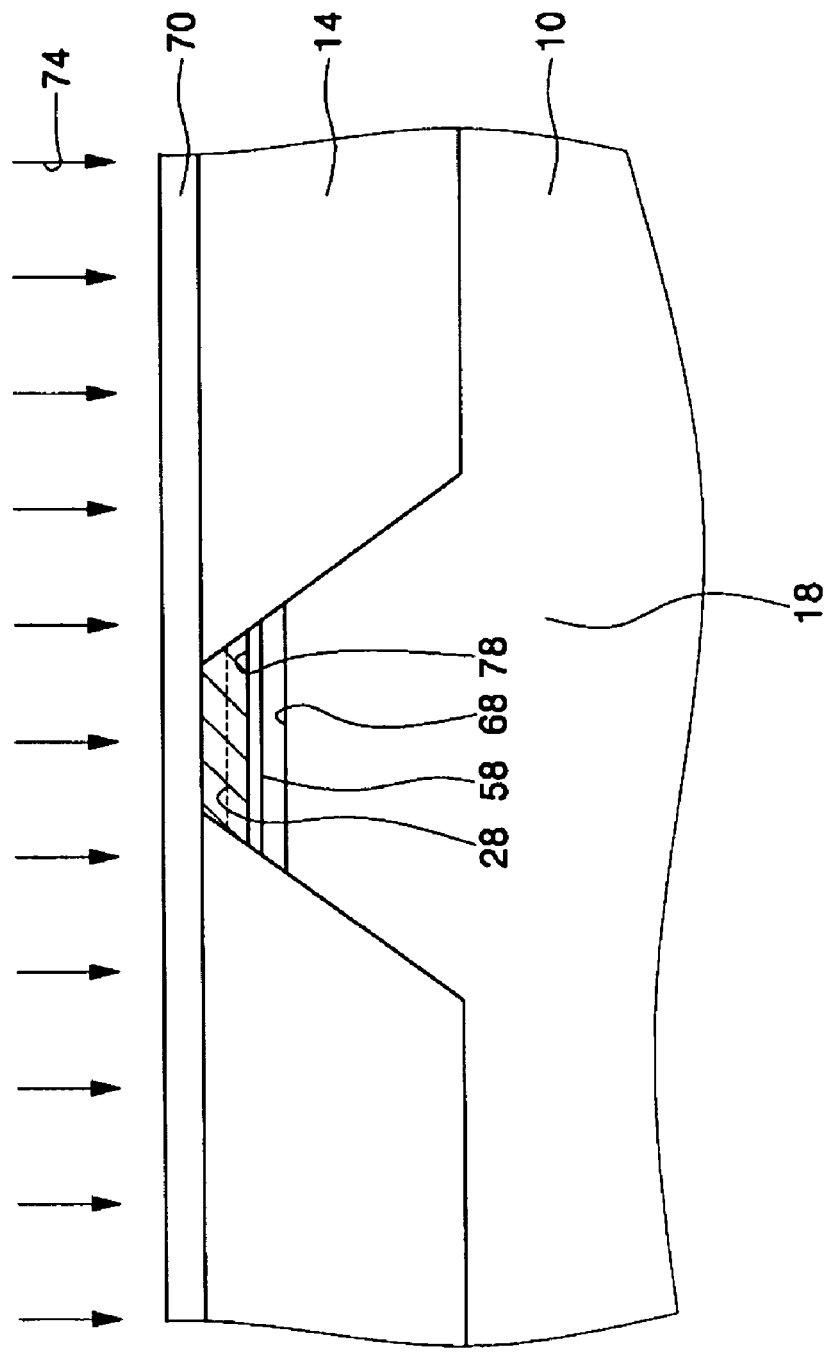

According to an example embodiment of the present invention, the conductive layer patterns 78, the second polysilicon layer patterns 48, the dielectric layer patterns 42, the first polysilicon layer pattern 38 compose two gate patterns 80 formed on the semiconductor substrate 10 as depicted in FIG. 12. The conductive layer pattern 78 of the semiconductor substrate 10 may act as a current leakage source when in direct contact with the semiconductor substrate 10. Thus, according to the example embodiment of FIG. 12, the impurity region 68 is provided to surround the conductive layer pattern 78 of the semiconductor substrate 10.

Figure 14:
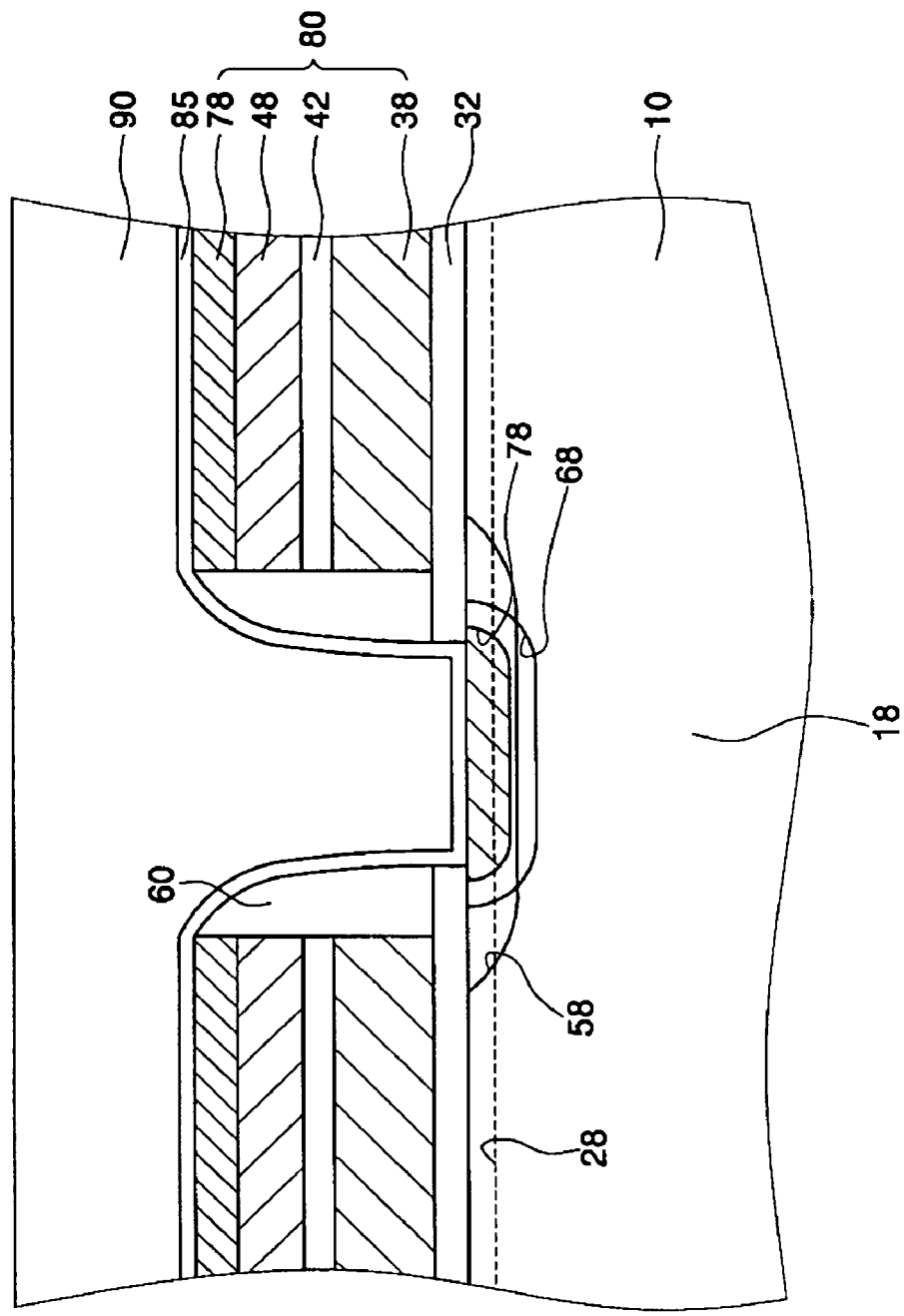
Figure 15:
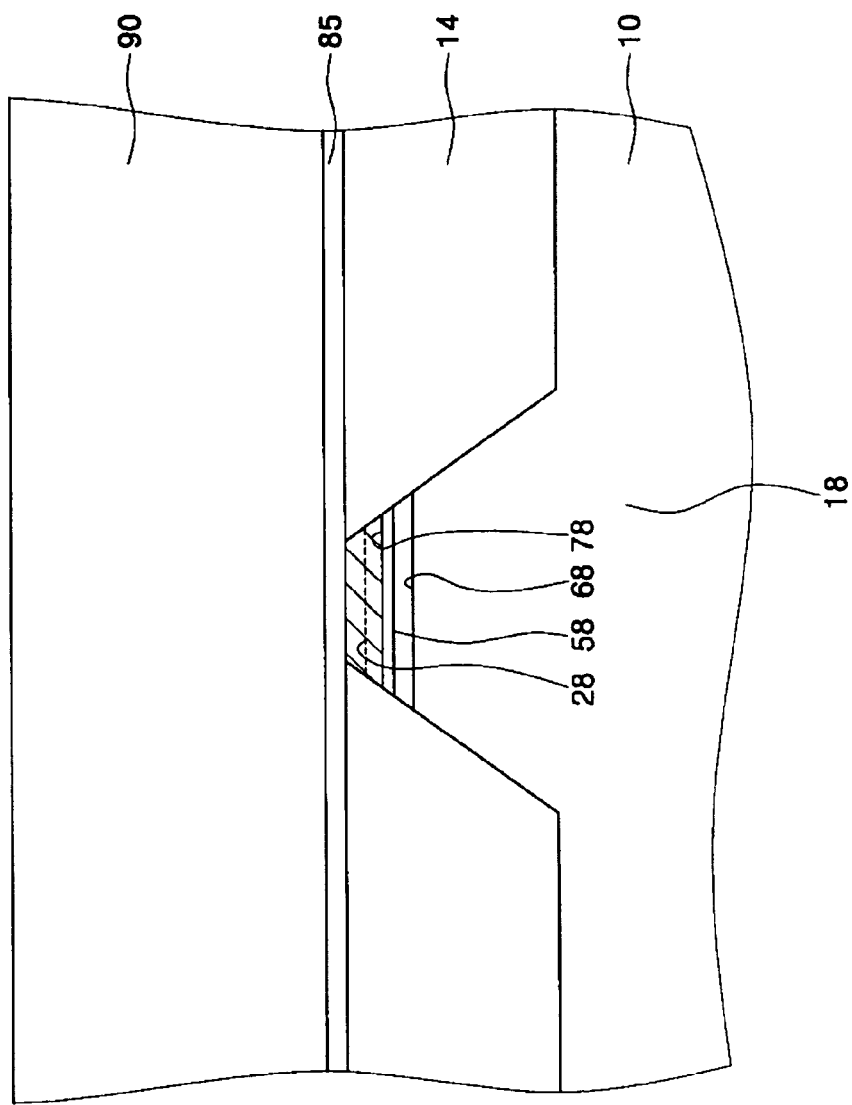

Referring to the example embodiments of FIGS. 14 and 15 of the present invention, etch buffer layer 85 and the buried interlayer insulating layer 90 which cover the gate patterns 80, the gate spacers 60, and/or the semiconductor substrate 10 may be formed in sequence. According to an example embodiment of the present invention, the buried interlayer insulating layer 90 may have an etching rate different from that of the gate spacer 60. Alternatively, the etch buffer layer 85 may have an etching rate equal to that of the gate spacer 60.

Figure 16:
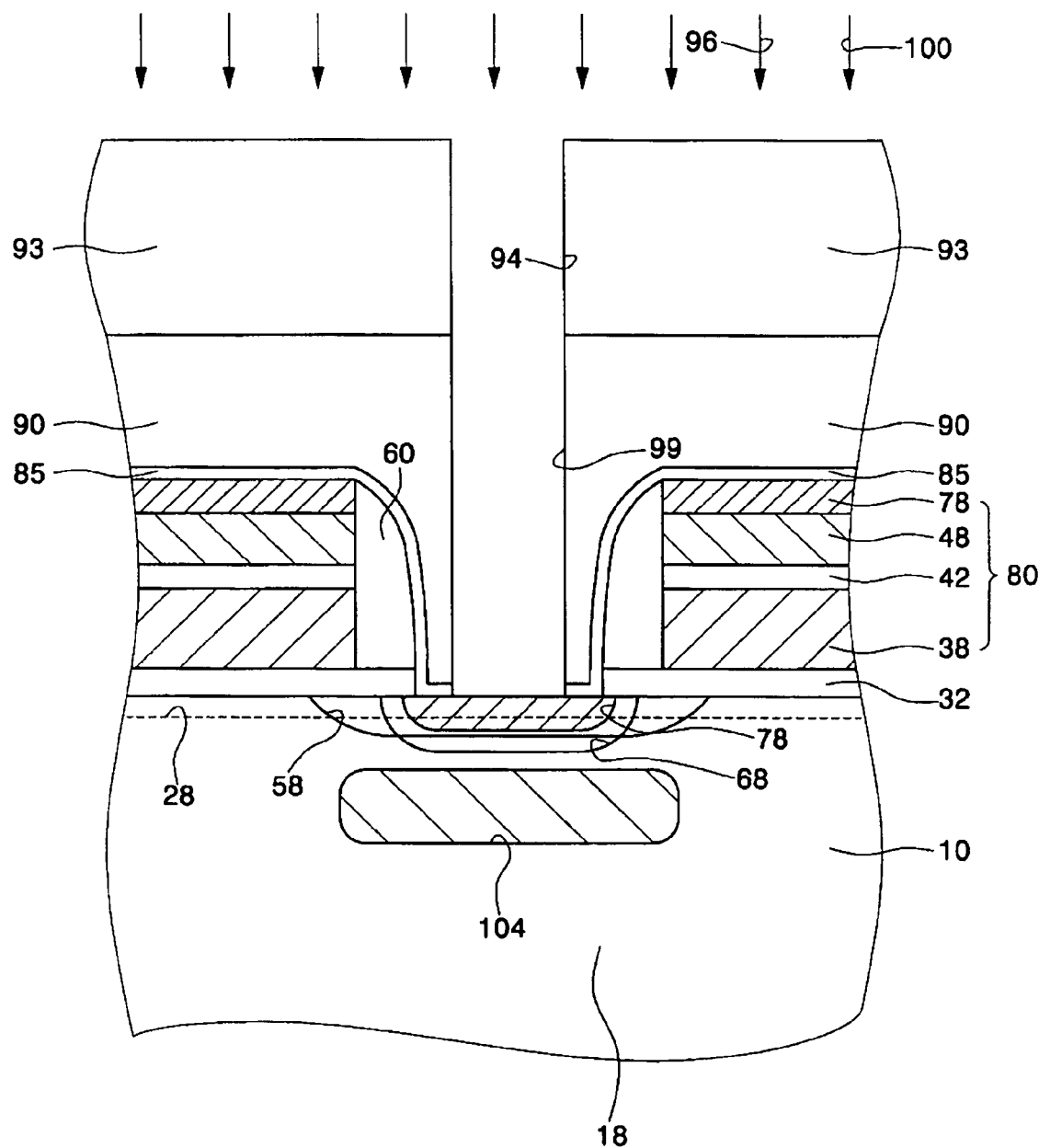
Figure 17:
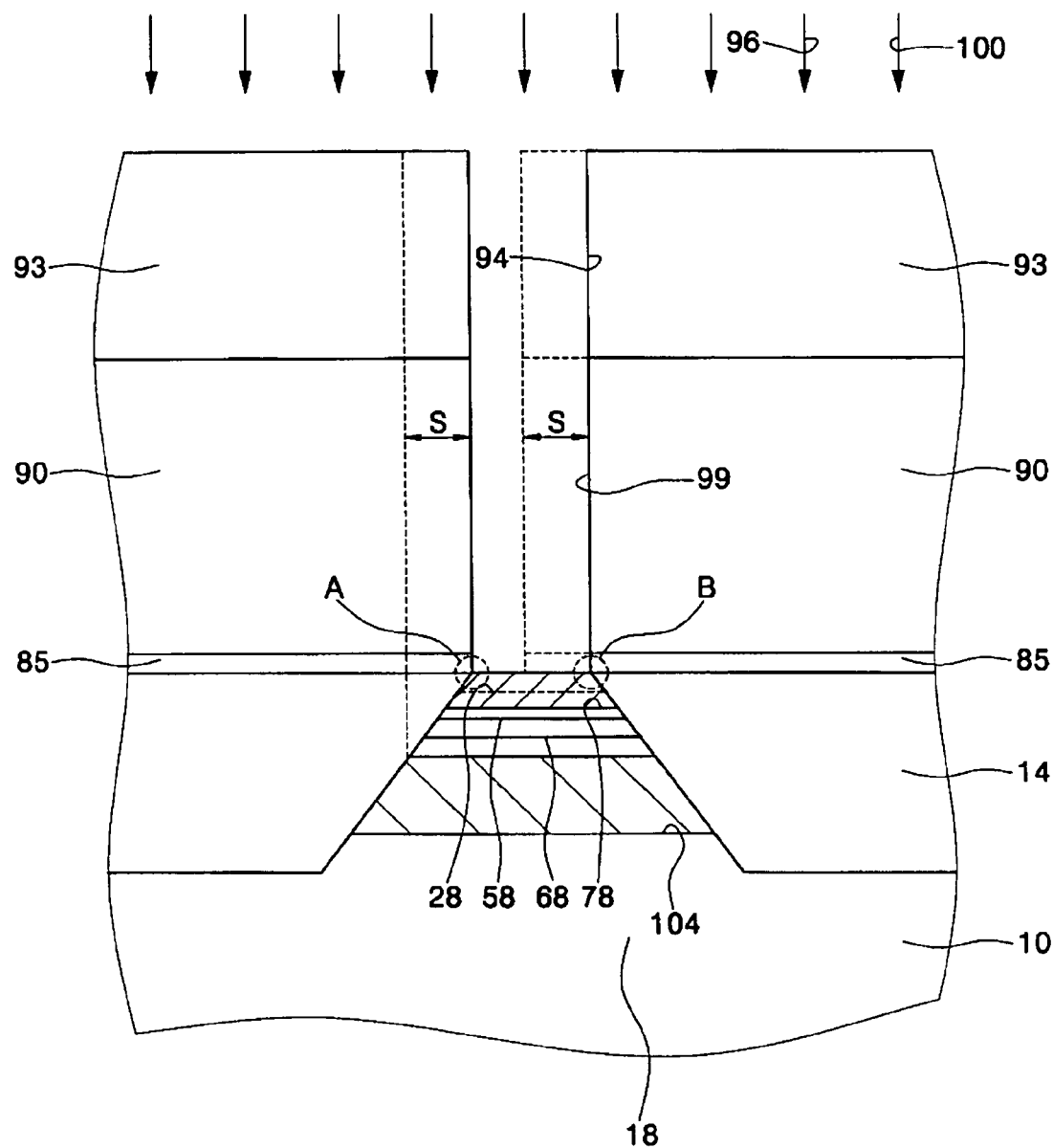

Referring to the example embodiments of FIG. 1 and FIGS. 16 through 19 of the present invention, a photoresist layer 93 having an opening 94 may be formed on the buried interlayer insulating layer 90. According to an example embodiment of the present invention, the opening 94 of the photoresist layer 93 may be located between the gate patterns 80 as depicted in FIG. 16. The buried interlayer insulating layer 90 and the etch buffer layer 85 may be subjected to an etching process 96 through the opening 94 using the photoresist layer 93 as an etching mask. By the etching process 96, the buried contact hole 99 exposing the semiconductor substrate 10 may be formed. That is, the buried contact hole 99 passes through the buried interlayer insulating layer 90 and the etch buffer layer 85 to reach the conductive layer pattern 78 of the semiconductor substrate 10 as depicted in FIG. 16. According to an example embodiment of the present invention, the buried contact hole 99 exposes at least the side portions A and B of the active region 18 as depicted in FIG. 17.

Referring to the example embodiments of FIGS. 16 and 17 of the present invention, the semiconductor substrate 10 may then be subjected to an ion implanting process 100 through the buried contact hole 99 using the photoresist layer 93, the buried interlayer insulating layer 90, and the etch buffer layer 85 as a mask. By the ion implanting process 100, another impurity region 104 may be formed in the semiconductor substrate 10 below the buried contact hole 99. According to an example embodiment of the present invention, the impurity region 104 may be formed below the conductive layer pattern 78 of the semiconductor substrate 10. According to another example embodiment of the present invention, the impurity region 104 may include the conductive type impurity ions (the same as those of the semiconductor substrate 10), for example, P+-type impurity ions. Alternatively, the impurity region 104 may include conductive type impurity ions (different from those of the semiconductor substrate 10), for example, N+-type impurity ions.

Referring to the example embodiment of FIG. 17 of the present invention, the buried contact hole 99 may be spaced from the sides of the active region 18 by a spacing S between the gate patterns 80 and pass through the device isolation layer 14. This is because the buried contact hole 99 may be formed based on the layout diagram of FIG. 1. That is, the buried contact hole 99 may pass through the side portions A and B of the active region 18 as depicted in FIG. 3. When the buried contact hole 99 is formed by the etching process 96, etching damage may occur in the semiconductor substrate 10. Accordingly, the impurity region 104 may be formed below the buried contact hole 99 to prevent etching damage to the semiconductor substrate 10, according to an example embodiment of the present invention. Thus, the impurity region 104 prevents (or reduces or minimizes) the formation of a current leakage source due to etching damage of the semiconductor substrate 10.

Figure 18:
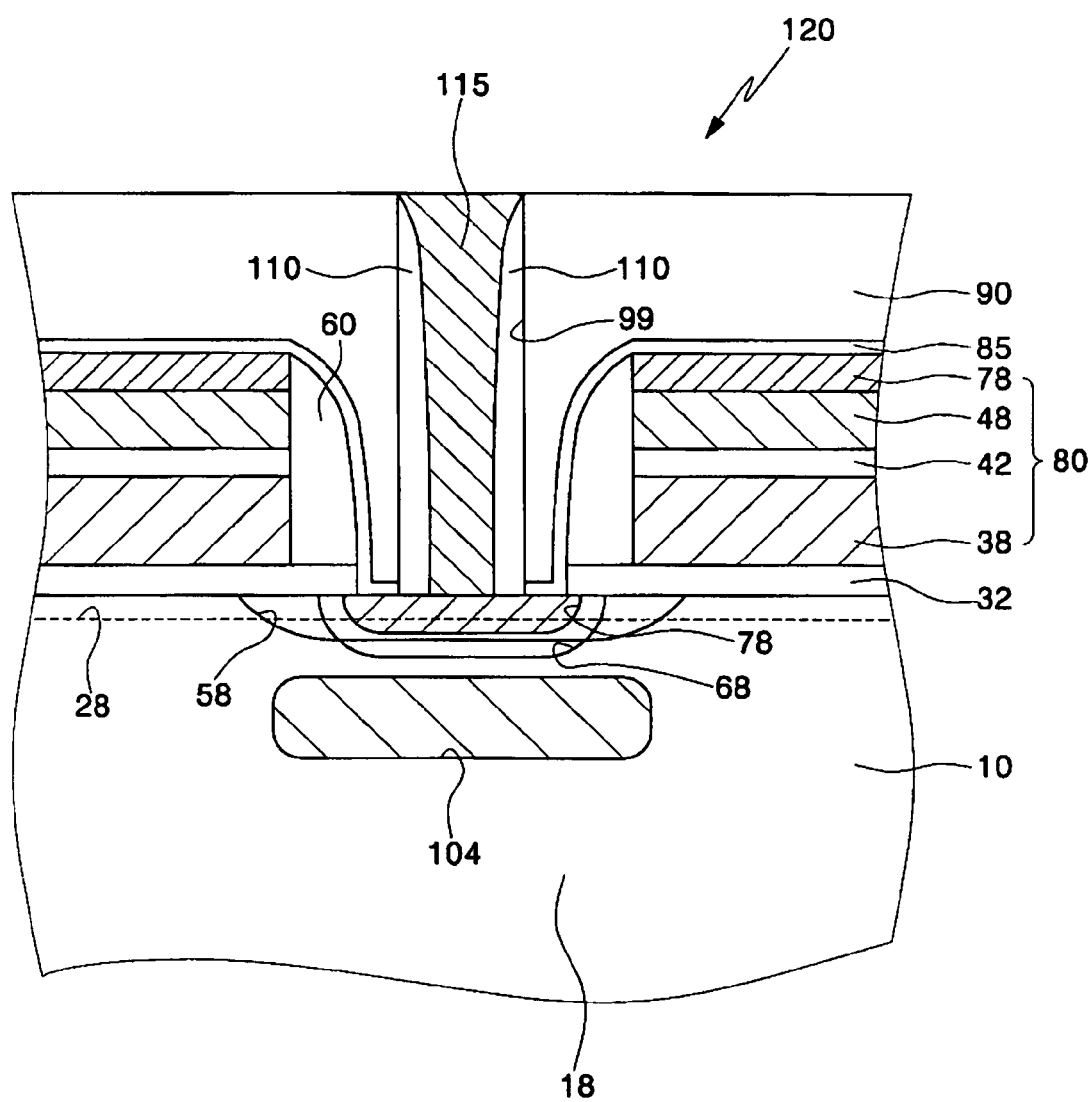
Figure 19:
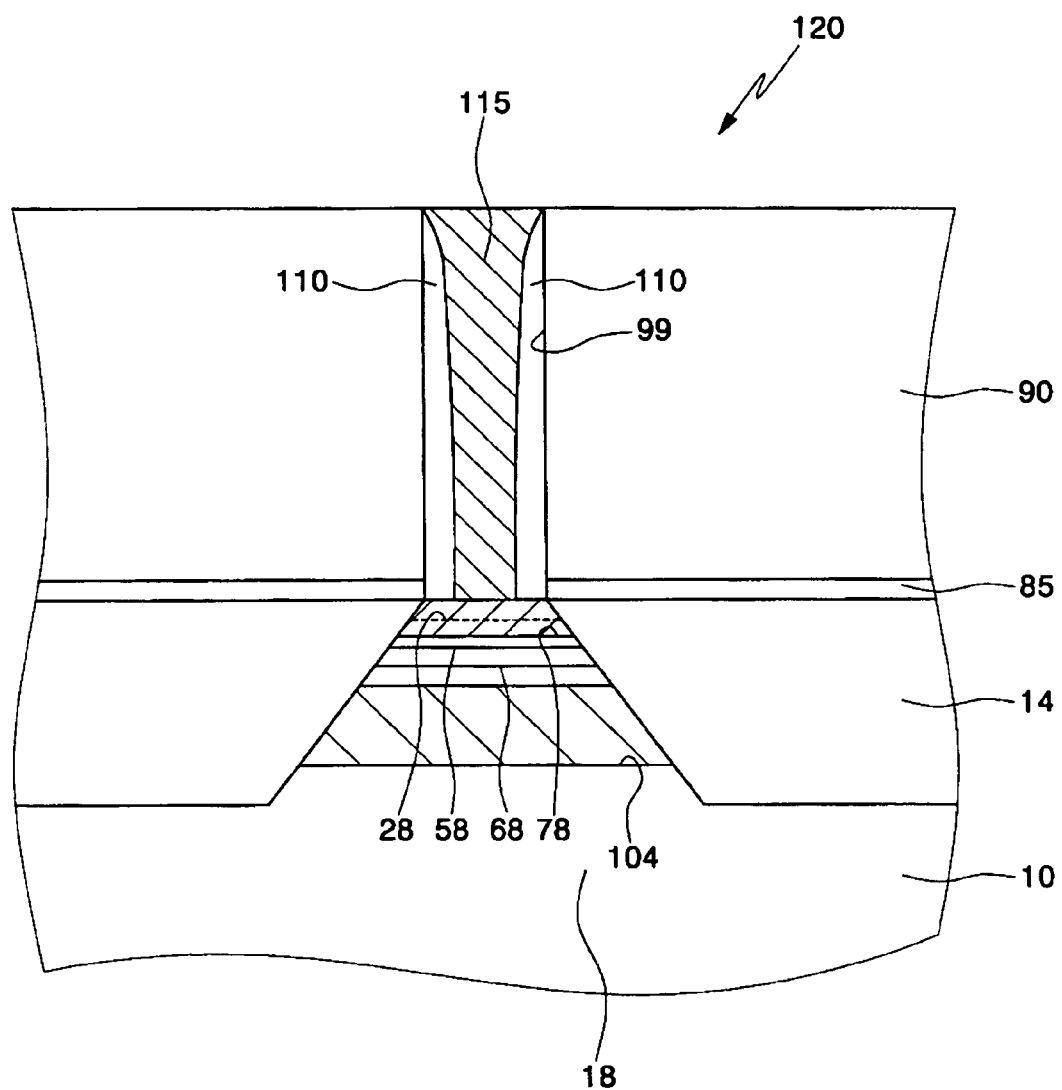

Referring to the example embodiments of FIGS. 18 and 19 of the present invention, the contact hole spacer 110 covering the sidewall of the buried contact hole 99 may be formed and then the buried conductive layer 115 may be used to fill the buried contact hole 99 as shown. According to an example embodiment of the present invention, the buried conductive layer 115 may be formed of tungsten. The buried conductive layer 115 in the buried contact hole 99 makes contact with the conductive layer 78 of the semiconductor substrate 10 as shown according to the example embodiments of FIGS. 18 and 19 of the present invention. Pursuant to an example embodiment of the present invention, the contact hole spacer 110 may have an etching rate equal to that of the gate spacer 60. The contact hole spacer 110 reduces the area of the buried contact hole 99. Further, the impurity region 104 prevents the buried conductive layer 115 from directly coming in contact with the semiconductor substrate 10. This configuration may reduce the formation of another current leakage source which may otherwise form due to the buried conductive layer 115. Thus, for example, a NOR type flash memory transistor 120 (or other type of transistor) including the buried conductive layer 115, the gate patterns 80, and the conductive layer patterns 78 may be formed. Types of transistors other than NOR type flash memory transistors may be formed in accordance with example embodiments of the present invention.

As mentioned above, example embodiments of the present invention provide an electrical node of a transistor and a method of forming the same, which forms a conductive layer pattern of the semiconductor substrate and an impurity region below a buried contact hole to minimize (or reduce) the current leakage during transistor operation.

Although the example embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electrical node of a transistor comprising:
   two gate patterns disposed on an active region of a semiconductor substrate, each having a first conductive layer pattern;
   a buried interlayer insulating layer disposed on the semiconductor substrate to cover the gate patterns having a buried contact hole on the active region between the gate patterns passing through the buried interlayer insulating layer;
   an etch buffer layer between the gate patterns and the buried interlayer insulating layer and between the buried interlayer insulating layer and the semiconductor substrate in a direction perpendicular to the gate patterns;
   an impurity region disposed in the semiconductor substrate below the buried contact hole located between the gate patterns and surrounded by the semiconductor substrate;
   a contact hole spacer disposed on a sidewall of the buried contact hole; and
   a buried conductive layer covering the contact hole spacer and filling the buried contact hole,
   wherein a second conductive layer pattern is disposed in the semiconductor substrate between the gate patterns, the buried contact hole is disposed on the second conductive layer pattern of the semiconductor substrate, and the sidewall of the buried contact hole is at least disposed to be aligned with a vertical plane passing through a side portion of the active region.

2. The electrical node according to claim 1, wherein the conductive layer pattern comprises metal silicide containing cobalt (Co).

3. The electrical node according to claim 1, wherein the buried conductive layer comprises tungsten (W).

4. The electrical node according to claim 1, wherein the contact hole spacer comprises silicon nitride ($Si_3N_4$).

5. The electrical node according to claim 1, wherein the buried interlayer insulating layer has an etching rate different from that of the contact hole spacer.

6. The electrical node according to claim 1, wherein each of the gate patterns includes a first polysilicon layer pattern, a dielectric layer pattern, and a second polysilicon layer pattern laminated in sequence, the first conductive layer pattern is disposed on the second polysilicon layer pattern, and the second polysilicon layer pattern and the first polysilicon layer pattern contain $N^+$-type impurity ions.

7. The electrical node according to claim 1, wherein the impurity region is disposed below the second conductive layer pattern of the semiconductor substrate and contains a conductive type ion which is the same as conductive ions of the semiconductor substrate.

8. The electrical node according to claim 1, wherein the impurity region is disposed below the second conductive layer pattern of the semiconductor substrate and contains a conductive type ion which is different from conductive ions of the semiconductor substrate.

9. The electrical node according to claim 1, wherein the etch buffer layer has an etching rate different from that of the buried interlayer insulating layer.

10. The electrical node according to claim 9, further comprising gate spacers disposed respectively on the sidewalls of the gate patterns below the etch buffer layer, wherein the gate spacers have an etching rate equal to that of the etch buffer layer.

11. The electrical node according to claim 1, further comprising an etch buffer layer between the buried interlayer insulating layer and the semiconductor substrate which are disposed between the gate patterns, wherein the etch buffer layer has an etching rate different from that of the buried interlayer insulating layer.

12. A method of forming a transistor comprising:
   forming two gate patterns on an active region of a semiconductor substrate, the two gate patterns having a first conductive layer pattern and the semiconductor substrate between the gate patterns having a second conductive layer pattern;
   forming a buried interlayer insulating layer on the semiconductor substrate to cover the gate patterns;
   forming an etch buffer layer between the gate patterns and the buried interlayer insulating layer and between the buried interlayer insulating layer and the semiconductor substrate in a direction perpendicular to the gate patterns;
   forming a buried contact hole passing through the buried interlayer insulating layer to expose the second conductive layer pattern of the semiconductor substrate;
   forming an impurity region in the semiconductor substrate below the buried contact hole, said impurity region being surrounded by the semiconductor substrate;
   forming a contact hole spacer covering a sidewall of the buried contact hole;
   forming a buried conductive layer covering the contact hole spacer and to fill the buried contact hole,
   wherein the buried contact hole is formed to expose at least a side portion of the active region.

13. The method according to claim 12, wherein the buried conductive layer is formed of tungsten.

14. The method according to claim 12, wherein the contact hole spacer is formed of silicon nitride.

15. The method according to claim 12, wherein the buried interlayer insulating layer has an etching rate different from that of the contact hole spacer.

16. The method according to claim 12, wherein the first and second conductive layer patterns are formed of metal silicide containing cobalt.

17. The method according to claim 12, wherein each of the gate patterns includes a first polysilicon layer pattern, a dielectric layer pattern, and a second polysilicon layer pattern laminated in sequence, the first conductive layer pattern is formed on the second polysilicon layer pattern, and the second polysilicon layer pattern and the first polysilicon layer pattern have $N^+$-type impurity ions.

18. The method according to claim 12, wherein the impurity region is formed below the second conductive layer pattern of the semiconductor substrate and formed to have a conductive type ion which is the same as conductive ions of the semiconductor substrate.

19. The method according to claim 12, wherein the impurity region is formed below the second conductive layer pattern of the semiconductor substrate and formed to have a conductive type ion which is different from conductive ions of the semiconductor substrate.

20. The method according to claim 12, wherein the etch buffer layer has an etching rate different from that of the buried interlayer insulating layer.

21. The method according to claim 20, further comprising forming gate spacers on sidewalls of the gate patterns to be located below the etch buffer layer, wherein the gate spacers are formed to have an etching rate equal to that of the etch buffer layer.

22. The method according to claim 12, further comprising forming an etch buffer layer between the buried interlayer insulating layer and the semiconductor substrate which are located between the gate patterns, wherein the etch buffer layer has an etching rate different from that of the buried interlayer insulating layer.

23. The method according to claim 12, wherein the forming the buried contact hole comprises:
   forming a photoresist layer having an opening on the buried interlayer insulating layer;
   performing an etching process to the buried interlayer insulating layer through the opening using the photoresist layer as an etching mask; and
   removing the photoresist layer,
   wherein the opening is located between the gate patterns, and the etching process is performed to expose the semiconductor substrate.

24. The electrical node according to claim 1, wherein the electrical node is of a NOR type flash memory.

25. The method of forming a transistor according to claim 12, wherein the transistor is of a NOR type flash memory.

* * * * *